United States Patent [19]

Chewning et al.

[11] Patent Number: 4,725,244
[45] Date of Patent: Feb. 16, 1988

[54] SYSTEM FOR ASSEMBLING AN ELECTRONIC WORK STATION

[75] Inventors: Patrick W. Chewning, Hillsboro; Michael T. Lancaster, Tigard, both of Oreg.

[73] Assignee: Tektronix, Inc., Beaverton, Oreg.

[21] Appl. No.: 70,131

[22] Filed: Jul. 2, 1987

[51] Int. Cl.⁴ .......................... H05K 7/10; H05K 7/14
[52] U.S. Cl. ...................................... 439/296; 29/830; 361/391; 364/708
[58] Field of Search ..................... 439/66, 74, 75, 257, 439/296; 361/391; 364/708; 29/854, 739, 742, 830, 831, 832

[56] References Cited

U.S. PATENT DOCUMENTS

| | | | |
|---|---|---|---|
| 3,728,662 | 4/1973 | Puri | 339/75 M |
| 3,903,404 | 9/1975 | Beall et al. | 364/708 |
| 4,084,250 | 4/1978 | Albertine et al. | 364/708 |
| 4,134,631 | 1/1979 | Conrad et al. | 339/75 M |
| 4,328,898 | 5/1982 | Grassi | 339/17 LM |
| 4,401,351 | 8/1983 | Record | 339/17 LM |
| 4,479,198 | 10/1984 | Romano et al. | 364/708 |
| 4,481,661 | 11/1984 | Spector | 361/391 |
| 4,491,981 | 1/1985 | Weller et al. | 361/391 |
| 4,498,123 | 2/1985 | Fuss | 361/391 |
| 4,501,460 | 2/1985 | Sisler | 339/75 M |
| 4,530,066 | 7/1985 | Ohwaki et al. | 364/708 |
| 4,582,381 | 4/1986 | Bisczat et al. | 439/296 |
| 4,661,921 | 4/1987 | Barnes | 364/708 |
| 4,669,053 | 5/1987 | Krenz | 364/708 |
| 4,672,510 | 6/1987 | Castner | 364/708 |
| 4,680,674 | 7/1987 | Moore | 364/708 |
| 4,685,753 | 8/1987 | Isshiki et al. | 439/74 |

Primary Examiner—Steven L. Stephan
Attorney, Agent, or Firm—Robert S. Harrington; John J. Horn; Robert S. Hulse

[57] ABSTRACT

A system for assembling electronic work stations including multiple electronic units. The electronic units are provided as subassemblies, premounted into specially formed trays. Special slide engaging male and female mounting components have one of the components formed into the chassis and the other component formed into the tray. The subassemblies are simply slid into place and various locking means are automatically engaged as the subassemblies are forced into their "home" position. The assembly time is greatly reduced resulting in substantial savings.

10 Claims, 9 Drawing Figures

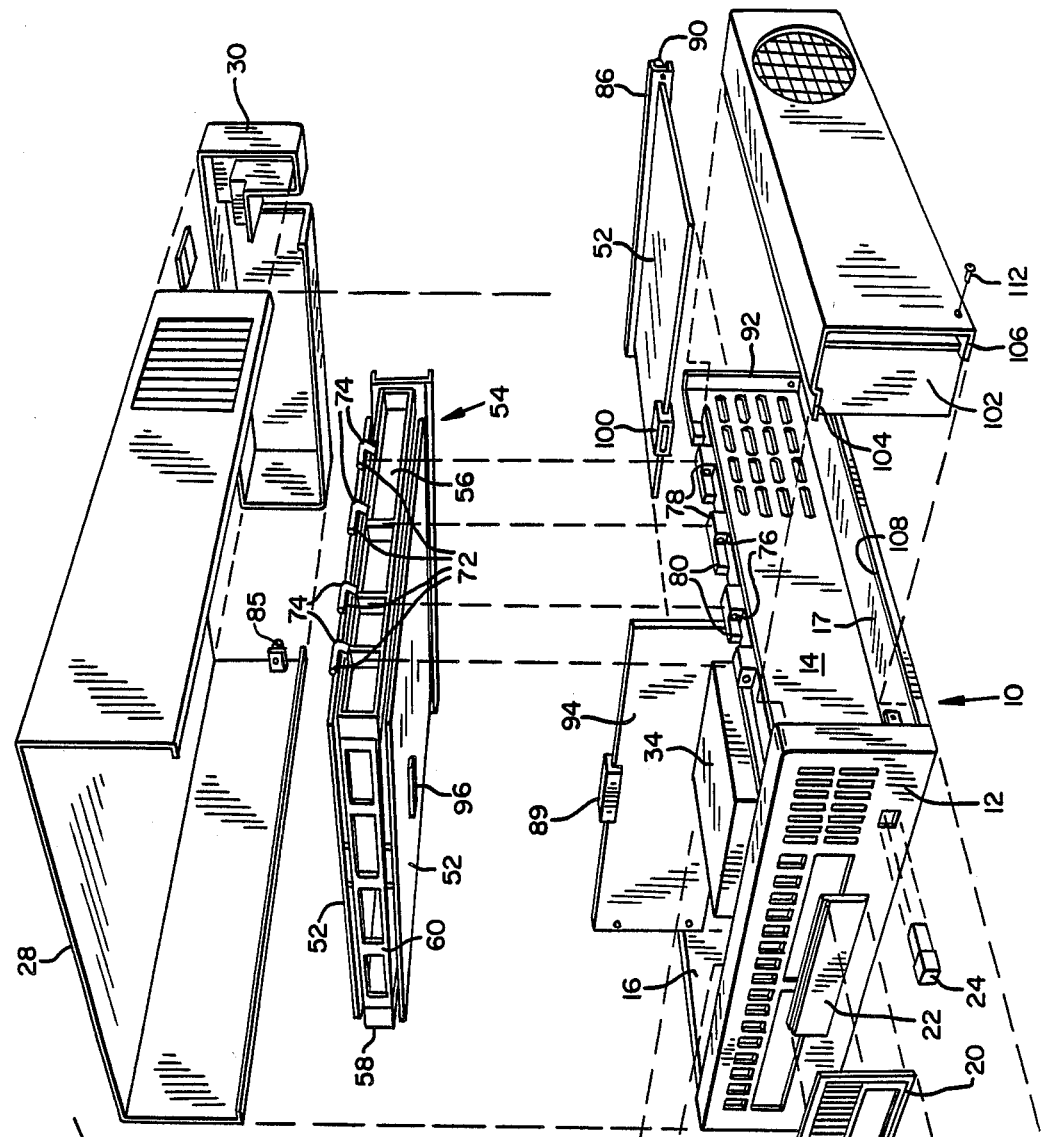
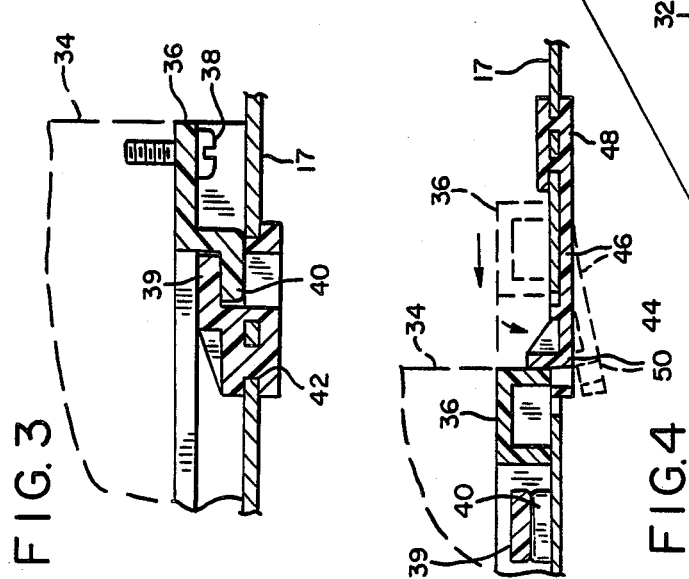

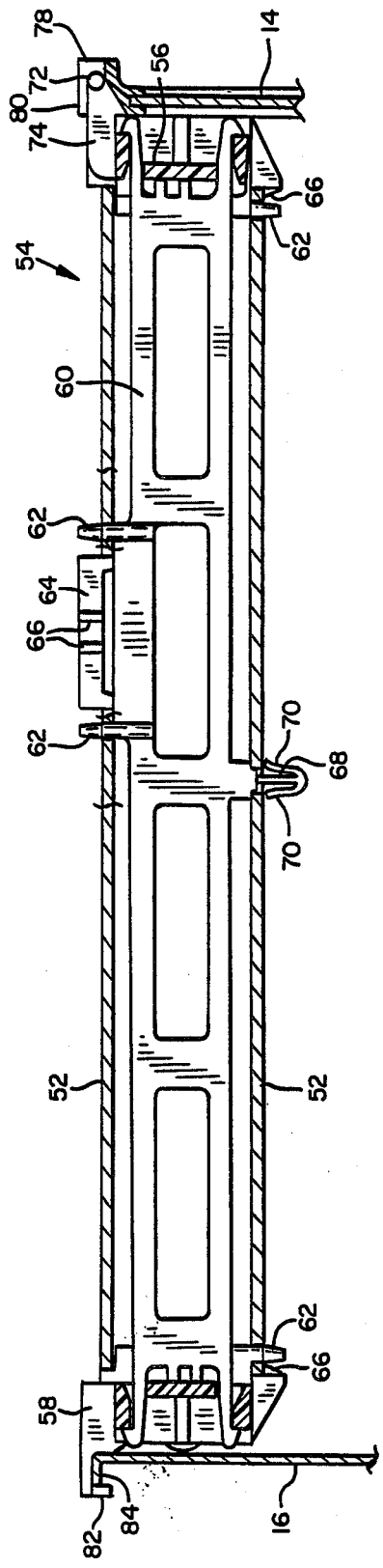
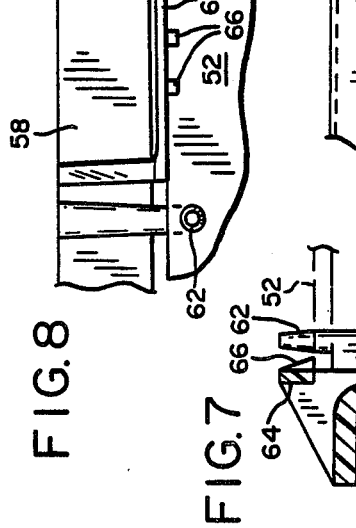
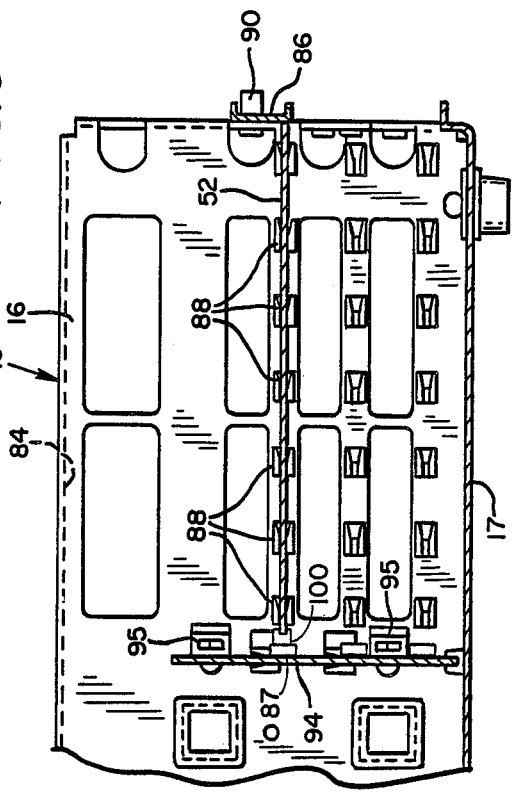
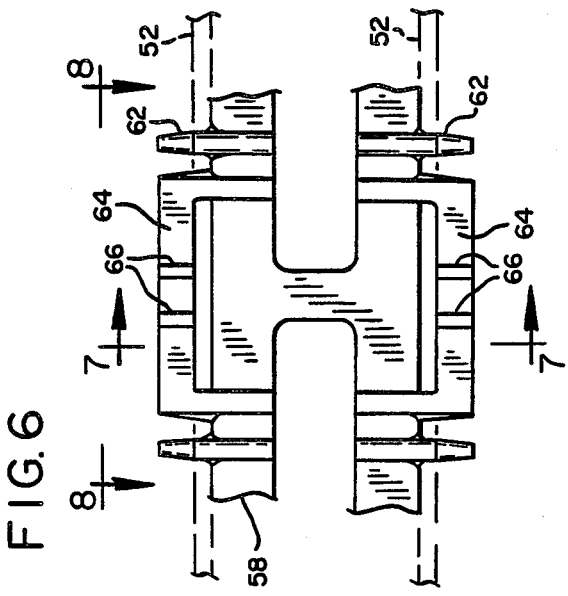

SYSTEM FOR ASSEMBLING AN ELECTRONIC WORK STATION

This is a continuation of application Ser. No. 656,635, filed Oct. 1, 1984.

FIELD OF THE INVENTION

This invention relates to an electronic work station comprised of the assembly of multiple subassemblies, and more particularly to an assembly design and system that provides improved efficiency in the assembling of the subassemblies that make up the work station.

BACKGROUND OF THE INVENTION

Electronic equipment in particular has been advanced in recent years to such a degree that equipment that used to fill an entire room and cost millions of dollars can now be assembled into a work station that will easily fit on a normal desk top, at a cost that can be measured in the several thousands of dollars. The various electronic circuitry has been miniaturized and can be rapidly and inexpensively printed on circuit boards. Automatic assembly line production processes can quickly and accurately build the various components that enable performance of the desired functions of the work station. The final stage is the assembling of the components and circuit boards into a completed unit making up the work station.

This final assembly process is typically accomplished in a manual operation. For example, a custom designed chassis is provided with the appropriate compartments wherein the subassemblies are to be mounted. The various subassemblies (e.g. which can be from 6 to 60 in number) are then one by one positioned in the designated compartments, manually fastened as by screws screwed into screw holes provided in the subassembly and chassis, and then electronically interconnected as by plugging in the appropriate conductors.

The entire process of assembly has typically required dozens and even hundreds of screws to be fastened into a single work station. Individual handling of each screw type fastener is a time consuming operation and the labor cost is a very major factor in the overall cost of the unit. It is to the reduction of this cost factor that the present invention is directed.

SUMMARY OF THE INVENTION

The present invention focuses on the consumption of time generated by the required handling of fasteners, particularly screw type fasteners. Such fasteners generally require a separate fastening component e.g. a screw, a tool for mounting the fastener, e.g. a screw driver, and the effort to achieve fastening e.g. the time to rotate the screw the dozen or so turns that it takes to drive the screw.

In the preferred embodiment of the invention, slidably interlocking male and female mounting components are formed on the chassis and subassemblies. These components do not require separate handling, no tool is required, and the time involved is merely the time it takes for the placement of the subassembly into the designated position in the chassis and sliding it home. Preferably, the chassis is provided with the male and/or female mounting components by molding the components into the chassis frame at the precise positions designated by the assembly designer. The subassemblies are preferably mounted in trays which are designed to fit the configuration of the electronic unit and to fit the positions designated for them in the chassis. The trays are provided (as by molding) with the counterparts of the chassis mounting components.

The mounting components are of the type wherein a male component e.g. a pin molded on the tray, is adapted to slide into the female component e.g. a slot or hole molded in the chassis. The mounting components are coupled with a lock feature that is automatically activated when the pin is appropriately positioned in the slot. Thus, the assembly process simply involves positioning the pins of the trays to engage the slots of the chassis and forcing the pins home until the automatic lock is engaged. This is accomplished in a matter of seconds compared to minutes with the screw type fastener. Over a period of time, many hours of labor are saved resulting in a vast savings in dollars.

BRIEF DESCRIPTION OF THE DRAWINGS

The invention will be more fully appreciated by reference to the following detailed description having reference to the accompanying drawings wherein;

FIG. 1 is an exploded perspective view of a desk top computer illustrating the various subassemblies that are required to be assembled together;

FIG. 3 is a cross sectional view as taken on view lines 3—3 of FIG. 2;

FIG. 4 is a cross sectional view as taken on view lines 4—4 of FIG. 2;

FIG. 5 is a cross sectional view as taken on views 5—5 of FIG. 2;

FIG. 6 is a side view as taken on lines 6—6 of FIG. 2;

FIG. 7 is a cross sectional view as taken on section lines 7—7 of FIG. 6;

FIG. 8 is a cross sectional view as taken on view lines 8—8 of FIG. 6; and

FIG. 9 is a cross sectional view as taken on view lines 9—9 of FIG. 2.

DESCRIPTION OF THE PREFERRED EMBODIMENT

Figure 2:
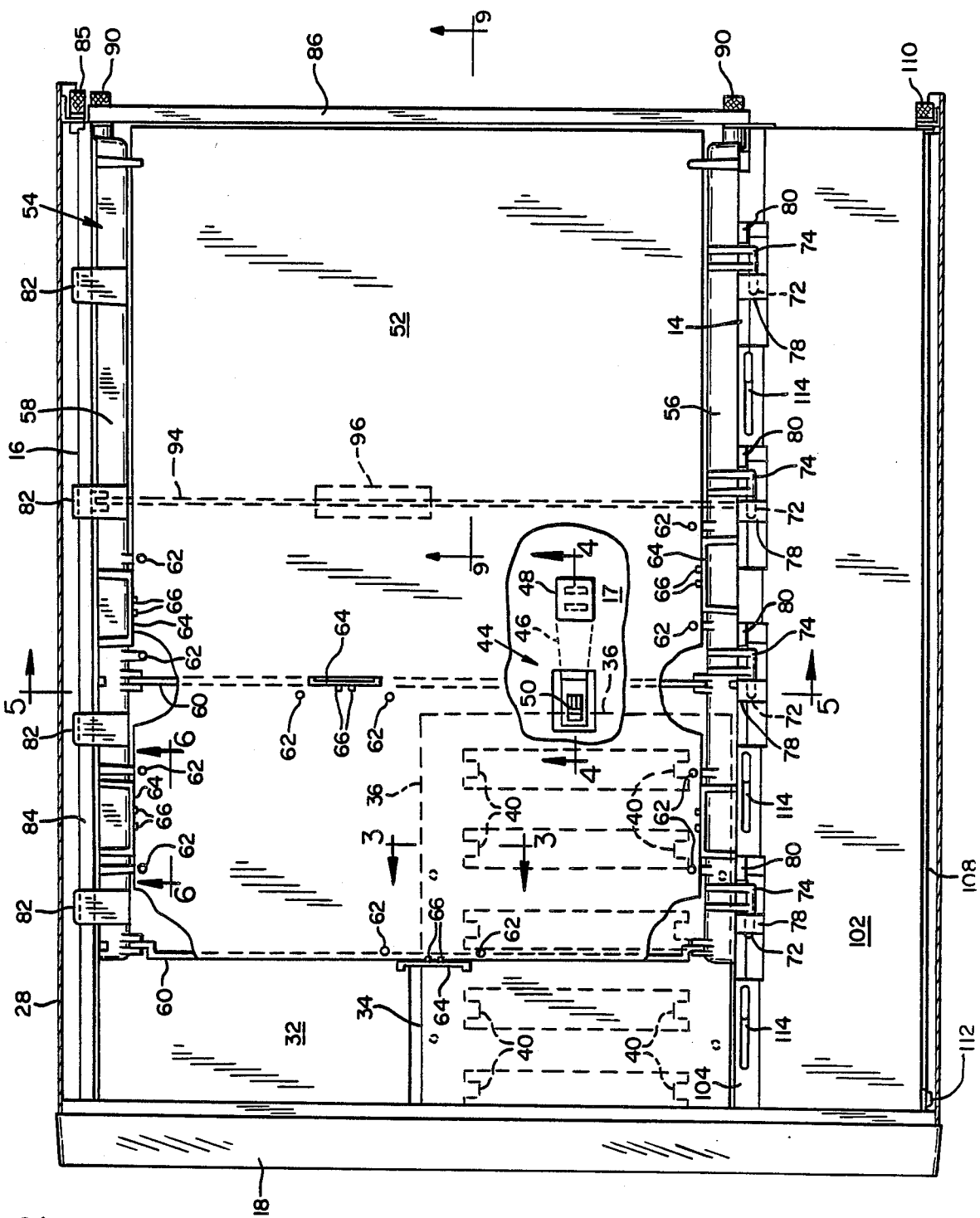
FIG. 2 is a top view of the unit of FIG. 1 with the top cover removed so as to illustrate certain ones of the interconnected subassemblies.

Referring to the exploded view of FIG. 1, the unit illustrated includes a chassis 10 having a front wall 12, a first side wall 14, a second side wall 16, and a bottom 17 (not shown in FIG. 1). Front wall panels 18, 20, 22, button 24 and removable decal 26 are all attached to the front wall by various clips and snap fasteners. The assembly of these parts to the work station is in accordance with conventional practice. Similarly, the top cover 28 and back cover 30 are typical for such assemblies and more specific disclosure of these parts and their assembly is deleted.

Reference will now be made to the assembly of disk units 32 and 34, representing a floppy disk subassembly and a hard disk subassembly respectively. As seen in FIG. 1, the disk units 32 and 34 are mounted on carrier trays 36 (as by screws 38).

The interlocking mounting components for the disk units are illustrated in FIGS. 2 thru 4. The carrier tray 36 is provided with ears 40 (the male mounting component) that are adapted to mate with finger like projections 39 that form, with the bottom wall 17, the female mounting component. The projections 39 are molded into the wall 17. The metal wall 17 is provided with gripping slots 42 and the projections are simply molded into the wall in a molding process i.e. molding forms are placed around the wall slots and molten plastic is poured into the forms and allowed to harden (sometimes referred to hereafter as spot molding).

Assembly of subassembly 34 (or 32) to the chassis is simply a matter of positioning the subassembly on the wall 17, with the ears 40 of the subassembly interleaved between the projections 39 but in line with the spacing provided under the projections. The unit is then slid forward until the ears 40 are slid under the projections 39 as illustrated in FIG. 3. The subassembly unit 34 is locked in place by locking member 44 (see FIGS. 2 and 4). The member 44 is molded into the wall 17 in a similar fashion to that of the projections 39, and include a spring biased arm 46 anchored at one end 48 with a stop tab 50 at its opposite end.

The initial placement of the unit 34 into alignment with projections 39, places the unit 34 on the member 44 and bends the member downward as illustrated in the dash lines of FIG. 4 (the end of the carrier tray 36 in its initial position is also shown in dash lines). When the carrier tray carrying unit 34 is slid home as seen in solid lines, the stop tab 50 springs back into place behind the carrier tray 36. The unit and carrier tray can not now be removed without first manually depressing the stop tab to permit reverse sliding of the carrier tray.

The assembly of circuit boards to the chassis will now be explained. There are a number of circuit boards 52 that are utilized in the illustrated work station. They are of different sizes and are generally mounted into the chassis with either of two different fastening concepts. The first is provided by a slide-pivotal fastener tray 54 and the several parts are illustrated in FIGS. 1, 2 and 5 thru 8. The tray 54 is comprised of side members 56, 58 interconnected by cross braces 60. The cross braces 60 and side members 56, 58 are provided with positioning pins 62 and securing bars 64. The positioning pins are slightly conical as particularly seen in FIGS. 5, 6 and 7. They are located and designed to mate with positioning holes in the circuit boards 52. The securing bars 64 are braced at each end and provided with central ribs 66 projecting outward from the bars.

Note that the ribs 66 are slightly wedge shaped (FIG. 7) to provide a ramp-like effect. The bars are resilient, and positioning of the circuit boards past the ribs causes flexing of the bars 64 (the central portion carrying the ribs) until the circuit board is forced down on pins 62 past the lower edge of the ribs 66. At this point the bars snap back into place with ribs 66 projected over the circuit board edge to lock the circuit boards onto the tray. This same fastener concept is used to fasten circuit boards to the bottom of the tray as seen in FIGS. 5, 6 and 7.

Also illustrated in FIG. 5 is another form of the fastening concept whereby a post 68 and flexible ribs 70 are provided on the same element but otherwise function in a similar manner i.e. the hole in the circuit board is forced over the ribs 70 with the ribs first collapsing to permit seating of the board and then expanding outwardly as shown in FIG. 5 to prevent removal of the board.

The tray 54 is fastened to the chassis as follows: Pivot pins 72 are projected forwardly from lugs 74 formed on the upper edge of the side wall 56 of the tray 54. Pin mating openings 76 are provided in lugs 78 formed on the chassis wall 14 (as by the spot molding process previously described). Locking embossments 80, molded as part of lugs 78, project forwardly on the lugs 78 leaving a limited spacing between the lugs. Whereas tray 54 is shown in a horizontal position in FIG. 1, in order for the pins 72 to be inserted in openings 76, the tray must first be oriented to a vertical position whereby the lugs 74 of the tray can be positioned along side the embossments 80, and slid forward to insert pin 72 in openings 76. The lugs 74 are then out of interferring alignment with the embossments i.e. they are positioned in the spacing between the lugs, and the tray can then be pivoted back to its horizontal position. The pins can not be withdrawn without pivoting the tray back to its vertical position.

Positioned on side member 58 of the tray are snap fitting flange elements 82 (formed of the resilient plastic). With the tray pivoted over the chassis i.e. in the closed position illustrated in FIG. 5, these flange elements 82 snap fit over the flange 84 formed on the side wall 16 of the chassis. It is desirable to secure certain parts of the assembly with screws, and this pivotal tray 54 is such a part. Thus it is further secured to the chassis by screws 85 screwed into flanges formed on the rear end edges of side wall 16 (see FIG. 2).

The second type of tray for the circuit boards is adapted to slide into the chassis, under the tray 54, and primarily utilizes the stiffness of the boards for support. These circuit boards are provided with a back plate 86 (FIGS. 1 and 9). Guide clips 88 (again spot molded into the chassis walls) guide the boards into the chassis and then support the boards in the home position as particularly viewed in FIG. 9. Back plate 86 is provided with locking screws 90 that screw into side flanges 92 of the side walls 14 and 16 of the chassis. This secures the back plate to the chassis and provides a rigid bracing across the rear end of the chassis.

The electrical connections are primarily achieved in the same motion whereby the various trays are locked into the home position. Note that a bracing wall 94 is inserted between the chassis walls (slid into and supported by channels formed in the walls). This bracing wall 94 provides the central connection for certain of the subassemblies. In this capacity the wall 94 functions as an electrical interface structure for interconnecting various of the components of the unit. Because of its stabilizing effect, this wall may be screwed into the side walls 14 and 16 e.g. into screw receiving nuts 95 that are secured to the walls 14 and 16, e.g. encased in plastic holders molded to the walls as by the spot molding process. Note that tray 54, when pivoted into place, produces connection of receptacles 96 of the tray with receptacle 89 of the bracing wall 94. Further, it will be understood that receptacle 100 on the circuit board, attached to back plate 86, connects to a mating receptacle 87 on bracing wall 94. The floppy disk and hard disk units 32 and 34 may be similarly connected but in the present embodiment are provided with cable connections (not shown).

The power unit 102 is also provided as a separate subassembly that is positioned in the compartment formed along side chassis wall 14. The lower end of the unit is placed in the channel 108 in side wall 14, and the top of the power unit is then pivoted to engage the upper edge of side wall 14 (thereby producing interengagement of the slot and tab fittings 114 illustrated in FIG. 2). The unit is slid forward inside front cover 12 and secured with screws, e.g. at the back (screw 110) and on the front side (screw 112). This securing of the power unit subassembly to the chassis greatly adds to the mechanical strength and stability of the completed assembly.

The assembly process first assumes the provision of the chassis walls with the various clips and lugs, spot molded into place, and it assumes the provision of the 5 subassemblies, including disk units 32 and 34 being mounted in carrier trays 36. It also assumes the circuit board holding trays 54 and 86 with circuit boards mounted therein.

The first step is to install the bracing wall 94 by sliding it into its channels on the side walls 14 and 16, and securing it by the screw and nut fasteners. The disk units in their carrier trays, are then positioned with ears 40 interleaved with projections 39 on the chassis, and with stop tab 50 depressed. The carrier trays are pushed home to force the ears 40 under the projections 39 at which point stop tab 50 snaps up behind the carrier trays to lock the trays into position.

The pivotal tray loaded with the designated circuit boards, is vertically oriented whereby the pins 72 are aligned with holes 76 in the chassis wall lugs 78. The tray is slid forward and pivoted down over the disk units, onto the bracing wall to be electrically connected into receptacles 89, and with end clamps 82 of the tray snap locking onto side wall 16 of the chassis.

Carrier trays comprised of the circuit boards mounted on the backing plates 86, are next located in the guide clips 88 on the chassis walls and driven home i.e. against bracing wall 94 to which receptacle 100 is thereby attached. The bottom of the power unit 102 is then positioned in channel 108 of the chassis wall 14, electrical cables are passed through the wall (through an opening not shown) to be connected to the subassemblies, it is then pivoted to interengage flange 104 with the upper edge of wall 14, slid forward inside cover 12, and locked into place, preferably with locking screws as indicated at 110 and 112. Finally, the covers including front covers 18, 20, and 22, top cover 28, and back cover 30 are locked into place.

Whereas assembly time can be varied, particularly dependent on the degree to which the subassemblies are completed, it has been found that assembly time can be reduced by as much as 75% using the novel concept of assembly described above. It is to be understood that this process has beneficial application to any number of applications wherein electronic subassemblies are to be connected into a unit of equipment, generally referred to herein as a work station. Whereas the steps of the assembly, the specific slide locking designs, and other aspects thereof may be modified without departing from this inventive concept, such variations and modifications are encompassed by the invention as will be determined by reference to the claims appended hereto.

We claim:

1. A system for physically positioning, mechanically securing, and electrically interconnecting two or more electrical subassemblies and thereby forming an electronic work station, said system comprising:
   (a) a support chassis including two substantially, spaced-apart and parallel planar side walls which define a rectangular space between said walls with respect to which there can be arbitrarily assigned forward and rearward directions parallel to the long dimensions of said side walls and upper and lower directions perpendicular to the long dimensions of said side walls;
   (b) an electrical interface structure for interconnecting subassemblies, said structure in the form of a bracing wall secured at right angles to and extending between said chassis side walls so as to define forward and rearward compartments within said rectangular space, and said interface structure having an upper edge and a rearward side and including a first electrical receptacle mounted on the upper edge of said interface structure and a set of second electrical receptacles mounted on the rearward side of said interface structure;
   (c) a first assembly in the form of a rectangular tray of the approximate size to cover the upper surface of said rectangular space, said first assembly including an electrical receptacle mounted on the bottom surface of the tray and one or more circuit boards mounted on either the top or bottom surfaces of said tray;
   (d) pivot means secured to one of the upper edges of one of said chassis side walls and to one of the side edges of said rectangular tray for allowing said tray to be pivoted into a position adjacent and parallel to the upper surface of said rectangular space in which position the first electrical receptacle on said interface structure is engaged with the electrical receptacle on said tray;
   (e) one or more second subassemblies in the form of circuit boards each circuit board of a size to fit within said rearward compartment and having an electrical receptacle mounted on one edge thereof; and
   (f) one or more guide track means attached to the interior of said rearward compartment parallel with the upper edges of said chassis side walls and in alignment with said second electrical receptacles on said interface structure for securing said second subassemblies within said rearward compartment and allowing said subassemblies to be slid forward against said structure in which position said electrical receptacles on the edges of said circuit boards of said second assemblies are engaged with said second receptacles on said interface structure.

2. The system of claim 1, further comprising: one or more third subassemblies in the form of block-shaped components and attachment means mounted in said forward compartment for detachably securing said third subassemblies adjacent to said interface structure in said forward compartment.

3. The system of claim 1 wherein said pivot means includes a set of lugs having forwardly projecting pivot pins attached to said side edges of said tray, a set of matching lugs attached to said upper edge of said chassis side wall having rearwardly accessible openings and a set of embossments associated with said matching lugs having rearwardly accessible openings for locking said tray against forward or rearward movement.

4. The system of claim 2 wherein said attachment means for securing said third subassemblies each include: a set of ears mounted on said third subassemblies, corresponding projections, mounted in said forward compartment for engaging said ears and holding down said third subassemblies when said ears are slid into engagement with said projections and locking members having spring biased arms and stop tabs for locking said third subassemblies in positions where said ears and projections are engaged.

5. The system of claim 1, wherein said one or more circuit boards mounted on said tray are mounted by means of positioning openings on said circuit boards and positioning pins and securing bars on said tray for engaging said circuit boards and locking them in position.

6. An apparatus for detachably mounting and electrically interconnecting circuit boards into an electronic work station, comprising:
(a) a flat rectangular tray having two substantially parallel lateral side members and one or more cross braces connecting said side members, said tray including:
1. attachment means for detachably securing said circuit boards on top and bottom surfaces of said tray,
2. a set of lugs secured to one of said lateral side members of said tray, said tray having pivot pins projecting parallel to said side member to which the lugs are secured,
3. a set of flange elements secured to the other of said lateral side members on the opposite side of said tray for said lugs,
4. an electrical receptacle mounted on the bottom surface of said tray;
(b) a first side wall having a first upper edge and a second side wall having a second upper edge, said side walls spaced apart by the approximate distance between said side members of said tray, and including:
1. a set of lugs secured to said first edge of said first side wall having openings adapted for engaging said pivot pins secured on said tray,
2. a set of embossments secured on said first edge of said first side wall for blocking movement of said pivot pins out of engagement with said openings when said tray is pivoted into its operative position,
3. a flange extending along said second edge of said second side wall, said flange adapted for being frictionally engaged by said flange elements on said tray; and
(c) an electrical interface structure in the form of a bracing wall secured between said side walls and including an electrical receptacle mounted on the edge of said structure which extends between said side walls and is adjacent to said tray, said electrical receptacle on said bracing wall positioned and adapted to engage said electrical receptacle on said tray when said tray is pivoted into its operative position with said flange elements engaging said flange.

7. The apparatus of claim 6, wherein said attachment means for detachably securing said circuit boards comprises a set of positioning openings in said circuit boards and a set of positioning pins and securing bars for engaging said openings and the edges of said boards and thereby locking said boards onto said tray.

8. A system for positioning and electrically interconnecting the components for an electronic work station, comprising:
a pivotally installed tray having circuit boards attached to top and bottom surfaces thereof and an electrical receptacle secured on the bottom surface thereof;
a plurality of slidably mounted circuit boards each having an electrical receptacle secured on a forward edge thereof, said plurality of circuit boards positioned along planes below and parallel to said tray;
an electrical interface in the form of a slidably installed wall having an electrical receptacle secured to a top edge thereof and a plurality at electrical receptacles secured to one side thereof, said electrical interface positioned perpendicular to and below said tray for allowing said receptacle on said tray to engage said receptacle on the top of said wall and positioned perpendicular to and in front of said plurality of slidably mounted circuit boards for allowing said receptacles on the edges of said slidably mounted circuit boards to engage said receptacles on the side of said wall.

9. The system of claim 8, wherein said plurality of slidably mounted circuit boards is of substantially lesser length than the circuit boards attached to said tray and said slidably installed wall is positioned a substantial distance from one of the ends of said tray, and further comprising one or more detachably mounted electrical components positioned below said tray and on the opposite side of said wall from said plurality of slidably mounted circuit boards.

10. The system of claim 8, wherein circuit boards attached to said tray are removably attached thereto by means of openings in the circuit boards and positioning pins and securing bars on said tray.

* * * * *